United States Patent

Lucas et al.

[11] Patent Number: 5,849,440
[45] Date of Patent: *Dec. 15, 1998

[54] PROCESS FOR PRODUCING AND INSPECTING A LITHOGRAPHIC RETICLE AND FABRICATING SEMICONDUCTOR DEVICES USING SAME

[75] Inventors: Kevin D. Lucas; Michael E. Kling; Alfred J. Reich; Chong-Cheng Fu; James Morrow, all of Austin, Tex.

[73] Assignee: Motorola, Inc., Schaumburg, Ill.

[*] Notice: This patent issued on a continued prosecution application filed under 37 CFR 1.53(d), and is subject to the twenty year patent term provisions of 35 U.S.C. 154(a)(2).

[21] Appl. No.: 792,670

[22] Filed: Jan. 29, 1997

Related U.S. Application Data

[63] Continuation-in-part of Ser. No. 674,378, Jul. 2, 1996, abandoned.
[51] Int. Cl.⁶ .................................................... G03F 9/00
[52] U.S. Cl. ................... 430/5; 430/311; 382/144
[58] Field of Search ..................... 430/5, 313, 311; 382/144

[56] References Cited

U.S. PATENT DOCUMENTS 5,553,273  9/1996  Liebmann ........................... 430/297
5,631,110  5/1997  Shioiri ................................. 430/5

OTHER PUBLICATIONS

Cobb, N. & Zakhor, A. "Large area phase–shift mask design", SPIE vol. 2197, p. 348, 1994.

Otto et al. "Automated optical proximity correction—a rules based approach", SPIE vol. 2197, p. 278, 1994.

Patti et al. "Phase–shifting masks: automated design and mask requirements", SPIE vol. 2197 p. 314, 1994.

Stirniman, John P. & Rieger, M.L., "Fast proximity correction with zone sampling", SPIE vol. 2197, p. 294, 1994.

*Primary Examiner*—Christopher G. Young
*Attorney, Agent, or Firm*—J. Gustav Larson

[57] ABSTRACT

A process for fabricating a semiconductor device includes the formation of a lithographic reticle (20) having a lithographic pattern (18) overlying a reticle substrate (10). In one embodiment, a reticle inspection database incorporates altered resolution assisting features (30,32) to inspect the lithographic pattern (18). The dimensional difference between the reticle inspection database and the lithographic reticle is substantially equal to the process bias realized during reticle fabrication. Inspection of the lithographic reticle (20) using a reticle inspection database containing altered resolution assisting features reduces the false detection of defects and provides increased sensitivity in the reticle inspection process.

18 Claims, 4 Drawing Sheets

PROCESS FOR PRODUCING AND INSPECTING A LITHOGRAPHIC RETICLE AND FABRICATING SEMICONDUCTOR DEVICES USING SAME

CONTINUATION IN PART

This application is a continuation-in-part of application Ser. No. 08/674,378, filed Jul. 2, 1996, now abandoned, by Kevin D. Lucas et al., and assigned to the assignee hereof, entitled "Process For Producing a Lithographic Reticle and Fabricating Semiconductor Devices Using Same".

FIELD OF THE INVENTION

This invention relates in general to a method for fabricating a semiconductor device, and more particularly, to a process for producing a lithographic reticle and using the reticle in semiconductor device fabrication.

BACKGROUND OF THE INVENTION

State of the art semiconductor integrated circuits include many thousands of semiconductor devices interconnected on a single chip of semiconductor material. As the complexity of the integrated circuits increases, more and more devices are packed into a single chip. In addition, the increased packing density requires that individual components be fabricated at reduced dimensions. The fabrication of sub-micron semiconductor devices requires increasing levels of complexity in the fabrication process. In particular, as device dimensions are reduced, pattern transfer operations become increasingly more difficult. The generation and use of lithographic reticles is at the forefront of the effort to reproduce geometric patterns of exceedingly small dimensions in semiconductor devices.

The pattern transfer process begins with the fabrication of a lithographic reticle. The lithographic reticle is subsequently used in lithographic operations to transfer a pattern, present on the reticle, to a pattern transfer film. The pattern transfer film is typically a photoresist film placed on a device layer overlying a semiconductor substrate. Any defects present in the lithographic reticle will be transferred to the pattern transfer film during semiconductor device fabrication. Accordingly, great effort is used during reticle fabrication to insure that pattern defects are detected at the time of reticle fabrication and before the reticle is used in a lithographic operation to fabricate a semiconductor device.

Typically, the pattern to be formed on a reticle is specified by program code contained in a reticle generation database. After creating a lithographic reticle, it is inspected for defects with either an automated inspection system, or by manual inspection. The inspection process is made more difficult by a tendency of the reticle fabrication process to poorly resolve small metal features, sharp corners, and line endings during reticle fabrication. Often, small features are incompletely resolved when reticle fabrication equipment is pushed to the limit of its resolution capability. For example, E-beam and optical imaging systems tend to suffer from diffraction problems that can cause poor resolution of small features in a pattern. The loss of resolution can distort the intended geometric pattern of the metal features produced on the reticle. For example, poor resolution can cause 90° corners to reproduce as rounded features on the reticle. Additionally, poor resolution can cause a foreshortening of individual metal leads, such that a lead having a length less than intended is produced on the reticle.

To address the loss of resolution and optical proximity effects commonly encountered in optical lithography, optical proximity correction structures can be placed in close proximity to metal traces formed on the reticle. The optical proximity correction structures, or resolution assisting features, form optically weighted structures that counteract the optical proximity effects and loss of resolution encountered during reticle fabrication. The resolution assisting features have dimensions smaller than the resolution limit of the lithography system imaging the pattern transfer film. By selectively including resolution assisting features in the mask pattern, shapes closer to the desired design can be obtained in the pattern transfer film, and subsequently in the patterned features of a semiconductor device.

Although the utilization of resolution assisting features improves the pattern transfer capability of a lithographic reticle, their application increases the complexity of the lithographic pattern formed on the reticle. The resolution assisting features together with the lithographic pattern itself must be inspected for defects prior to transferring the lithographic reticle to a semiconductor device fabrication facility. The reticle inspection process is made more difficult by the placement of numerous resolution assisting features in the lithographic pattern. Additionally, the resolution assisting features also experience significant deformation during pattern transfer operations when the lithographic reticle is formed.

One method of compensating for the increased difficulty in inspecting lithographic reticles having resolution assisting features is to desensitize the detection level during reticle inspection. By desensitizing reticle inspection parameters, the detection of false defects is avoided. However, by desensitizing the inspection algorithm, real defects present in the lithographic pattern can go undetected. For example, contamination particles and other defects may not be detected by a desensitized inspection algorithm. Accordingly, improvements in lithographic reticle fabrication are necessary to avoid poor resolution, and to meet the quality standards demanded by state of the art semiconductor device fabrication.

Figure 1:
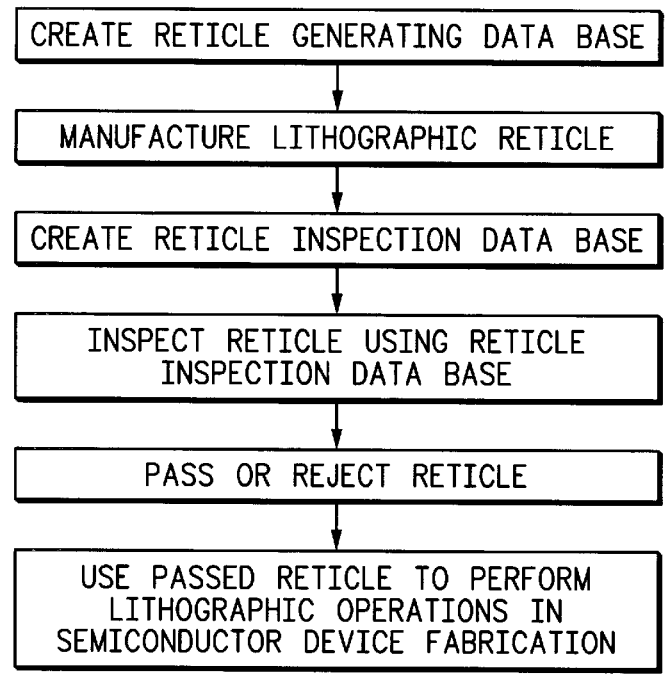
FIG. 1 is a process flow diagram showing processing steps in accordance with the invention.

It will be appreciated that for simplicity and clarity of illustration, elements shown in the FIGURES have not necessarily been drawn to scale. For example, the dimensions of some of the elements are exaggerated relative to each other. Further, where considered appropriate, reference numerals have been repeated among the FIGURES to indicate corresponding elements.

DETAILED DESCRIPTION OF PREFERRED EMBODIMENTS

The present invention provides a process for fabricating a semiconductor device in which a lithographic reticle is created using a reticle generating database and inspected using a reticle inspection database. The process of the invention uses a reticle inspection database having inspection dimensions that are altered from those initially specified in the reticle generating database. Specifically, the reticle inspection database incorporates modified inspection dimensions of the resolution assisting features. The magnitude of the inspection dimensions are modified from the dimension in the reticle generation data base by an amount substantially equal to the anticipated processing bias arising during the manufacturing of the lithographic reticle. The anticipated process bias can be determined by theoretical calculation, or by empirical data obtained during reticle fabrication. By incorporating the anticipated process bias into the reticle inspection database, substantial time and cost savings are realized in the production and testing of lithographic reticles. The reduction in reticle fabrication time enables faster delivery to the semiconductor manufacturing facility.

As illustrated in FIG. 1, a series of steps including database generation and physical processing are carried out to create and inspect the reticle, and to use the reticle to create pattern features on a semiconductor device. In step A), a reticle generating database is created. The database defines exposure areas for a mask generating system to write a particular geometric pattern on an initial reticle. In step B), a lithographic reticle is manufactured using the initial reticle created by the reticle generating database. In step C), a reticle inspection database is created to inspect the features formed on the initial mask by the reticle generating database. In step D), the lithographic reticle is inspected by analyzing the pattern using a reticle inspection database. In step E), the lithographic reticle is either passed or rejected based upon the results of the inspection. Finally, in step F), reticles passing the reticle inspection step are used to perform lithographic operations in the fabrication of semiconductor devices. Those skilled in the art will recognize that other process sequences are possible. For example, the reticle inspection data base can be created before manufacturing the lithographic reticle.

Figure 2:
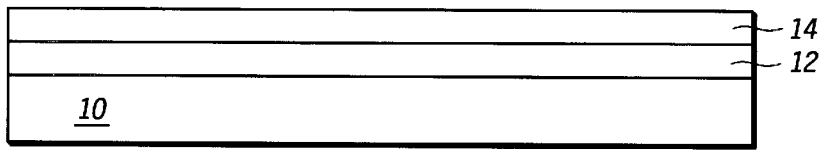
FIGS. 2–4 illustrate, in cross-section, processing steps for the manufacture of a lithographic reticle in accordance with one embodiment of the invention.

Shown in FIG. 2, in cross-section, is a reticle substrate 10 having a metal layer 12 overlying reticle substrate 10 and a pattern transfer layer 14 overlying metal layer 12. Reticle substrate 10 can be any of a number of compounds commonly used for the formation of lithographic reticles. For example, reticle substrate 10 can be silica glass, fused quartz glass, or another material transparent to various types of radiation commonly used in semiconductor lithographic operations. Metal layer 12 can be a homogeneous metal layer, such as chrome, gold, and the like. Alternatively, metal layer 12 can be a composite material of different metals, such as chrome and gold, or chrome and another metal, and the like. In yet another alternative, metal layer 12 can be an attenuating material employed in a phase shifting mask.

The pattern transfer material used to form pattern transfer layer 14 will depend upon the radiation characteristics of the equipment used to form the lithographic reticle. For example, where an E-beam direct write system is used, pattern transfer layer 14 will be an E-beam sensitive photoresist. Alternatively, where an optical system is used to generate radiation of a particular wavelength, pattern transfer layer 14 will be a conventional photoresist material sensitive to the particular wavelength. For example, dimethylnapthaquinone (DNQ) resist is commonly used for i-line and g-line optical systems.

Those skilled in the art will recognize that many different combinations of materials can be used to form the layers shown in FIG. 2. Accordingly, the present invention contemplates the use of many different types of material depending upon the particular lithographic system to be used in the fabrication of semiconductor devices, this includes deep-ultraviolet (deep UV), x-ray, and standard i-line and g-line lithographic systems.

Figure 3:
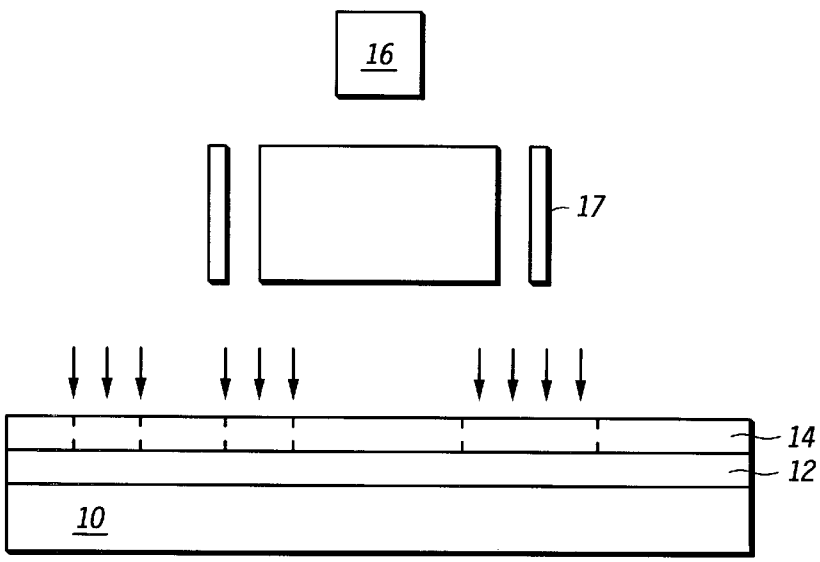

After preparing reticle substrate 10 with metal layer 12 and pattern transfer layer 14, pattern transfer layer 14 is exposed to radiation by a scanning E-beam or laser, as illustrated in FIG. 3. Radiation emerging from a radiation source 16 is imaged onto pattern transfer layer 14 by deflecting electrons through deflector system 17. The magnetic deflectors in deflector system 17 deflect the electron beam directly onto pattern transfer layer 14. The imaging process results in the transfer of a pattern present in the reticle generating data base to pattern transfer layer 14.

The arrangement shown in FIG. 3 generally illustrates an E-beam direct write system. However, it is also possible to perform pattern transfer using an optical imaging process using radiation having a wavelength ranging from the deep-UV to about 200 nanometers to optical wavelengths up to about 440 nanometers. For example, in the case of a DNQ resist, exposure of pattern transfer layer 14 to radiation causes a rearrangement of the chemical bonds within pattern transfer layer 14. The chemical bond rearrangement renders the exposed portions of the material soluble in a chemical developer having a high pH, such as sodium hydroxide solutions.

Figure 4:
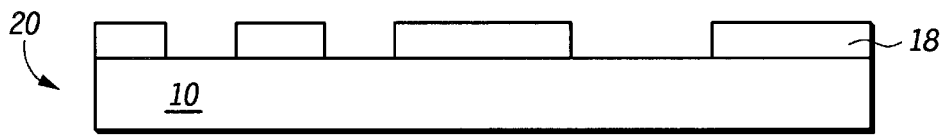

Upon developing pattern transfer layer 14 and etching metal layer 12, a lithographic pattern 18 is formed on reticle substrate 10, as illustrated in FIG. 4. Lithographic pattern 18 includes a large number of pattern metal features overlying reticle substrate 10. Lithographic pattern 18, together with reticle substrate 10, form a lithographic reticle 20. The exact arrangement of metal traces in lithographic pattern 18 will depend upon the particular masking level for which lithographic reticle 20 is to be used. For example, where lithographic reticle 20 is to be used to form interconnect traces in a semiconductor device, lithographic pattern 18 will include a series of lead traces having the necessary geometric arrangement to form metal interconnects in a semiconductor device. In other applications, lithographic reticle 20 can be used to form, for example, gate electrodes in a semiconductor device, or via openings in an interlevel dielectric layer, and the like.

Those skilled in the art will recognize the reticles can be of two general types, either brightfield or darkfield. In a brightfield reticle patterned features to be transferred are opaque features on a clear background. In a darkfield reticle, patterned features to be transferred are clear on an opaque background. For example, lithographic reticle 20, as depicted in FIG. 4, is a brightfield reticle. However, the process of the invention is intended to function with either type of reticle. In the case of a darkfield reticle, lithographic pattern 18 will appear as openings in a sheet of opaque material overlying reticle substrate 10.

Figure 5:
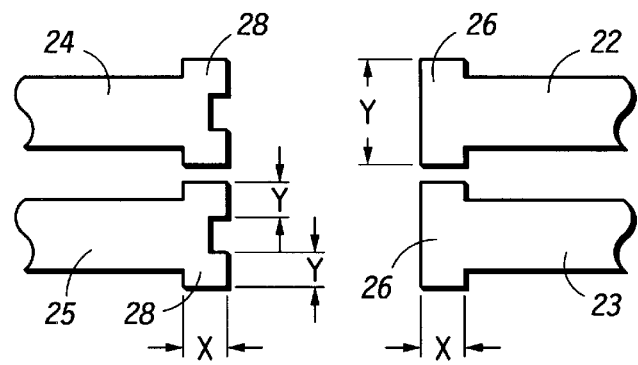
FIG. 5 illustrates a top view of metal traces having resolution assisting features.

Shown in FIG. 5 is a top view of an exploded portion of lithographic reticle 20. Portions of metal traces 22, 23, 24, and 25 overlie a surface portion of reticle substrate 10. Each metal trace includes a resolution assisting feature at the terminal end of the metal trace. Metal traces 22 and 23 include resolution assisting feature 26 at the terminal ends of the traces. Correspondingly, metal traces 24 and 25 include resolution assisting feature 28 at the terminal ends of the metal traces. Resolution assisting features 26 and 28 can be characterized by a horizontal dimension, (denoted x), and a vertical dimension, (denoted y).

Horizontal dimension x and vertical dimension y are characteristic dimensions of resolution assisting features 26 and 28. Metal traces 22, 23, 24, and 25, and resolution assisting features 26 and 28 are generated by the reticle generating database previously described. The horizontal and vertical characteristic dimensions of the resolution assisting features and the metal traces are created by program instructions entered into the reticle generating database. Often, as a result of processing steps illustrating in FIGS. 3 and 4, the actual horizontal and vertical dimensions of the metal traces and the resolution assisting features are not precisely reproduced on reticle substrate 10. The dimensional difference between the actual dimensions obtained on the reticle and the desired predetermined characteristic dimensions entered into the reticle generating database is known as process bias.

Typically, process bias results from the inability of the reticle writing step, illustrated in FIG. 3, and the etching step, illustrated in FIG. 4, to precisely resolve the patterns contained within the reticle generating data base. For example, when the physical dimensions of the metal traces approach the resolving limit of the image generation system, optical effects, such as diffraction, prevent transfer of a precise image to pattern transfer layer 14. Additionally, the etching process used to transfer the pattern formed in pattern transfer layer 14 to metal layer 12, can fail to precisely reproduce the pattern developed in pattern transfer layer 14.

In addition to processing induced errors, pattern reproduction is also influenced by the proximity of pattern features to one another. For example, where metal trace images having a high packing density are imaged onto a pattern transfer layer on a semiconductor substrate, diffraction effects can result in a widening of the exposure field for these traces. One particular problem in the case of circuit fabrication with extremely small traces is the foreshortening of lines formed in the pattern transfer film overlying a semiconductor substrate. To counteract this effect, resolution assisting features, such as features 26 and 28, are included at the terminal ends of the metal traces.

Figure 6A:
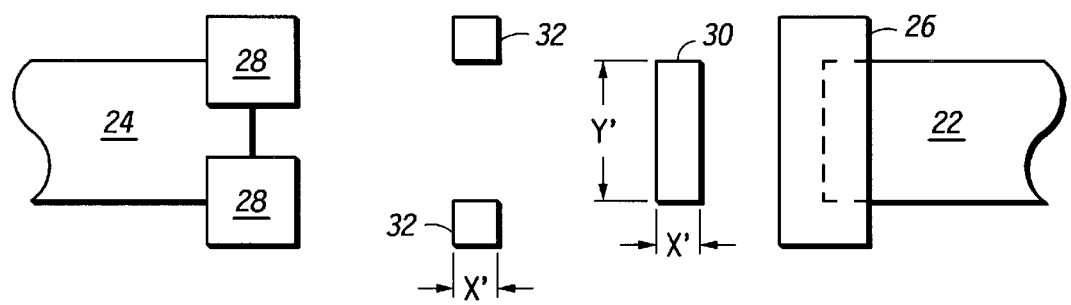
FIG. 6a illustrates a top view of altered resolution assisting features structured in accordance with one embodiment of the invention.

In accordance with the invention, measurement values are entered into the reticle inspection database to compensate for the expected process bias encountered in the transfer of the characteristic dimensions from the reticle generating database to the metal traces formed on the reticle substrate. FIG. 6a illustrates, in top view, altered resolution assisting features (altered RAP) 30 and 32. Altered RAF 30 and 32 have horizontal dimension x' and vertical dimension y'. The horizontal and vertical dimensions of altered RAF 30 and 32 differ from the horizontal and vertical dimensions of RAF 26 and 28 by the anticipated process bias to be encountered in the fabrication lithographic reticle 20. In accordance with the invention, the dimensions x' and y' are programmed into the reticle inspection database and applied when inspecting lithographic reticle 20. During inspection, the reticle inspecting program aligns altered RAF 30 and 32 to RAF 26 and 28, respectively.

By applying altered RAF 30 and 32 during reticle inspection, false errors can be avoided that otherwise would arise from a mismatch of the actual RAF formed on reticle substrate 10 and the RAF applied by the reticle inspection program during the inspection procedure. In addition, the sensitivity of the reticle inspection program can remain high for the detection of actual mass defects not arising from process bias. For example, the sensitivity of the reticle inspection program can remain high enough to detect extremely small contaminant particles and feature irregularities resulting from incomplete processing, and the like. Application of the reticle inspection program generated in accordance with the invention can improve the quality of the reticle inspection procedure, while avoiding detection of false errors thus decreasing the amount of time necessary to perform reticle inspection.

Figure 6B:
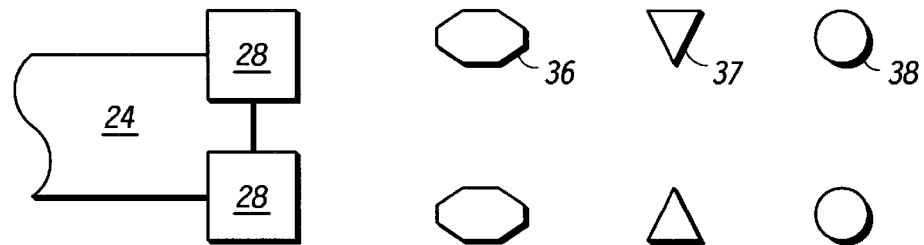
FIG. 6b illustrates a top view of various geometric designs of resolution assisting features suitable in practicing the invention.

Those skilled in the art will recognize that many different geometric arrangements of resolution assisting features are possible. In FIGS. 5 and 6a, RAF 26 has a rectangular geometry and forms a "hammerhead" at the terminal ends of metal traces 22 and 23. RAF 28 is a simple square added to the corners of the terminal ends of metal traces 24 and 25. Additional geometric designs suitable for use as resolution enhancing features are illustrated, in top view, and FIG. 6b. For example, resolution assisting features 28 can be a polygon 36, a triangle 37, or a circular structure 38, and the like. Irrespective of the particular geometric design employed to create the resolution assisting feature, the characteristic dimensions of the resolution assisting feature will be adjusted by an amount substantially similar to the anticipated process bias. In the embodiment illustrated in FIG. 6a, altered RAF 30 and 32 have a smaller characteristic dimension than RAF 26 and 28. This is in anticipation of a processing bias that reduces the characteristic dimensions from that originally programmed in the reticle generating database. It is equally possible to create altered RAF that have a characteristic dimension larger than the original RAF dimensions.

Figure 6C:
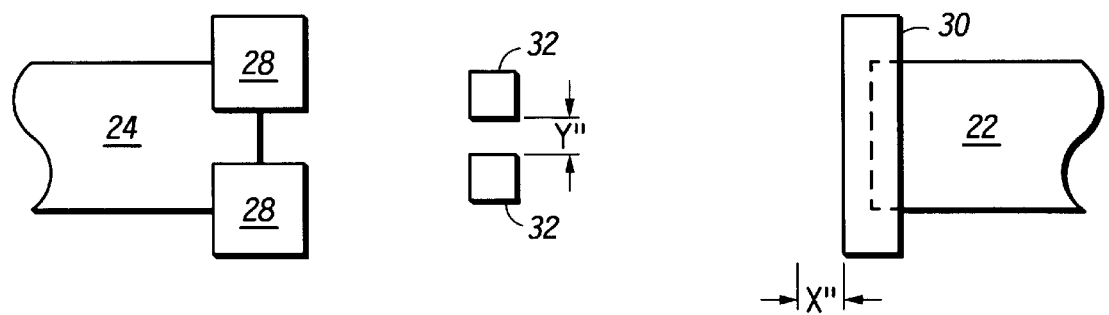
FIG. 6c illustrates a top view of altered resolution assisting features structured in accordance with an alternative embodiment of the invention.

Another altered RAF inspection method is illustrated in FIG. 6c. In addition to having reduced dimensions x' and y', altered RAF 32 also have a reduced offset distance, (denoted as y"). By reducing the offset distance between altered RAF as y"), the reticle inspecting program can be adjusted to compensate for reductions in the width of metal lines created on reticle substrate 10.

FIG. 6c illustrates yet another method for applying altered RAF to metal traces formed on reticle substrate 10. Altered RAF 30 is offset a horizontal distance, (denoted as x"), with respect to metal trace 22. In addition to having reduced horizontal and vertical dimensions, altered RAF 30 is offset onto the terminal end of metal trace 22. The application of altered RAF 30 as illustrated in FIG. 6c can compensate for line foreshortening expected to occur during the reticle formation process.

Figure 6D:
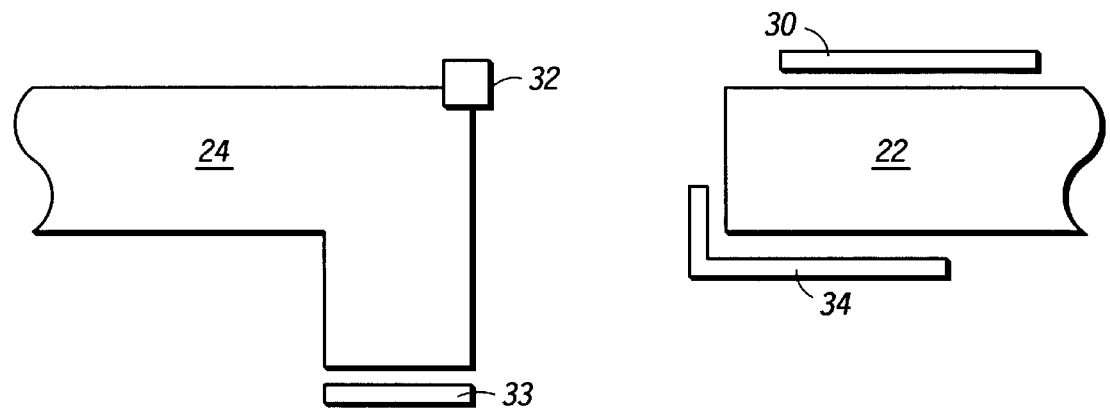
FIG. 6d illustrates a top view of further geometric designs of resolution assisting features suitable in practicing the invention.

FIG. 6d illustrates a further method for applying altered RAF to metal traces formed on reticle substrate 10. Altered RAF 32 can be inserted at corners of metal traces to assist in the resolution of sharp corners in a metal trace pattern. Additionally, lines, such as altered RAF 33, can be placed adjacent to the terminal end of metal trace 24. Altered RAF 31 and 34 are placed adjacent to the sides and terminal end of metal trace 22. Consistent with the approaches shown in FIGS. 6a and 6c, altered RAF 31, 33, and 34 can be reduced in size (x'/y') or offset at a distance x" from the metal traces. Also line features such as altered RAF 31, 33, and 34 can be offset at x" and have reduced dimensions x' and y'.

In addition to the techniques illustrated in FIGS. 6a–6d, those skilled in the art will recognize that other approaches are possible and can yield improved reticle inspection. For example, polygons, such as polygons 36, can be added to altered RAF 30 and 32 to provide a precise reticle inspection database in cases where square features suffer rounding during reticle processing.

Figure 7:
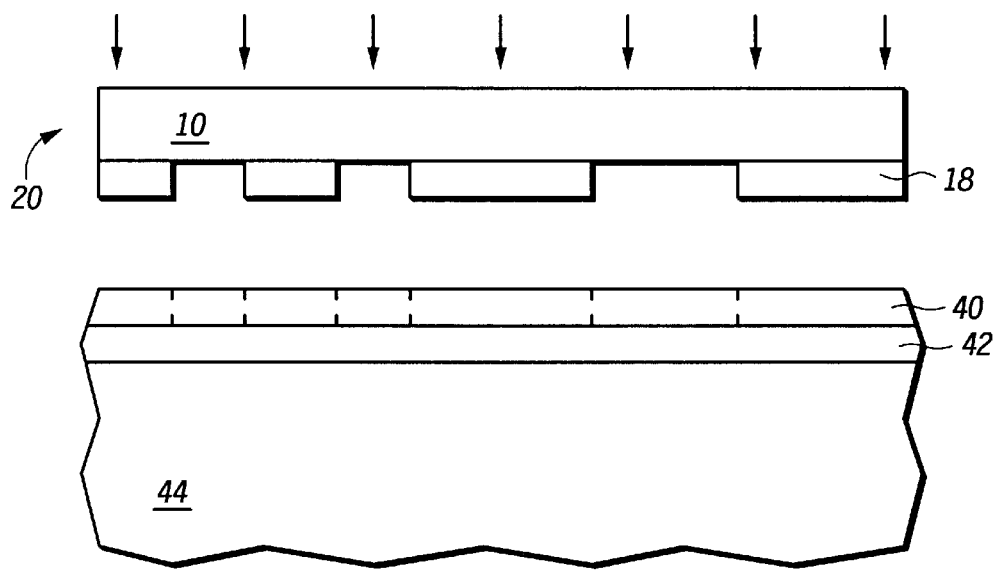
FIG. 7 illustrates, in cross-section, the utilization of a lithographic reticle, formed in accordance with the invention, to transfer a pattern to a semiconductor device.

Once lithographic reticle 20 has been inspected by the reticle inspection database and passed to the semiconductor manufacturing facility, a lithographic operation can be carried out as illustrated in FIG. 7. Lithographic reticle 20 functions to transfer lithographic pattern 18 to a lithographic layer 40 overlying a device layer 42, which in turn overlies a semiconductor substrate 44. The process of transferring lithographic pattern 18 to lithographic layer 40 is improved by application of the process of the invention. Minute defects in lithographic reticle 20 that may have been undetected because of desensing during reticle inspection procedures of the prior art will be detected by the application of the inventive process. Accordingly, fewer defects in lithographic pattern 18 will remain undetected and subsequently transferred to lithographic layer 40.

Thus it is apparent that there has been provided, in accordance with the invention, a process for producing a lithographic reticle and using the reticle to fabricate a semiconductor device, which fully meet the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, many different reticle assemblies can be used, such as reticle frames, pelicals, and the like. Furthermore, the present invention contemplates all methods of compensating for process bias in reticle inspection, including thickness deformation in the metal patterns, and the like. It is therefore intended to include within the invention all such variations and modifications as fall within the scope of the appended claims and equivalents thereof.

For example, a design database not using RAF may benefit from the altered verification features of the present invention. Specifically, for a design database containing small geometries, the amount of process bias, as previously discussed, proportionally increases relative to the feature size to create a mismatch between features of the desired reticle generation data base and the actual reticle feature. In order to assist in the verification process, where no RAF features are used, the present invention can use inspection dimensions that are altered to more closely approximate the expected reticle features. In another example, a design with RAF in which the RAF are not separable from the original design data may benefit from the altered verification features of the present invention. This situation can arise in certain methods of adding RAF to the original design data. The non-separable RAF then become small geometries in the design database and the verification process can benefit from using inspection dimensions that are altered to more closely approximate the expected reticle features.

Figure 8:
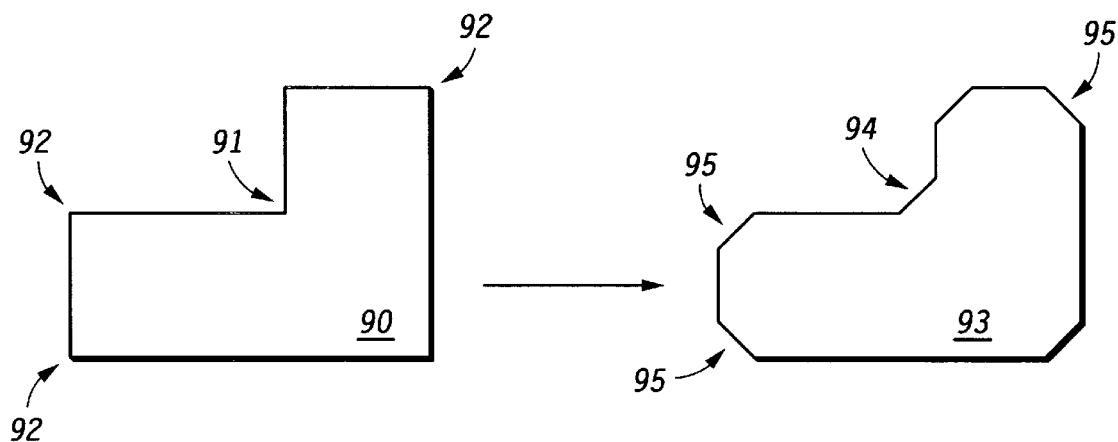
FIG. 8 illustrates a top view of altered reticle features in accordance with one embodiment of the present invention.

One way of accomplishing this is to apply a mitre/smoothing function to the reticle generation database to form the reticle inspection database. Referring to FIG. 8, a feature 90 from the reticle generation database is illustrated. The feature 90 is the ideal or specified shape which is desired on the reticle itself. As previously discussed, the ideal shape is in reality not obtained due to limitations of pattern transferring during the reticle manufacturing process. The application of a mitre/smoothing function to the feature 90 produces the feature 93 which is stored in the reticle inspection database. Feature 93 illustrates how outside corners 92, of feature 90 which have been mitred forming mitred corners 95, as well as inside corner 91 which have been smoothed to form smoothed corner 94. By providing a reticle inspection database having features with smoothed and mitred corners, the die-to-database inspection tool can utilize higher resolution parameters to inspect the tool. This is important in that the use of unmodified reticle generation database may require a low resolution verification parameters which tend to allow valid errors to be undetected.

The mitred and smoothed features are generated using existing design and design rule checking tools such as the DRACULA tool from Cadence. These tools have the capability to identify corners and subsequently to mitre or smooth them by removing or adding triangular shapes. In addition, it is capable for these tools to identify features having varying sizes and shape, and perform a different mitre/smoothing function accordingly. For example, a very small contact may need more mitring and smoothing than a larger metal run.

Figure 9:
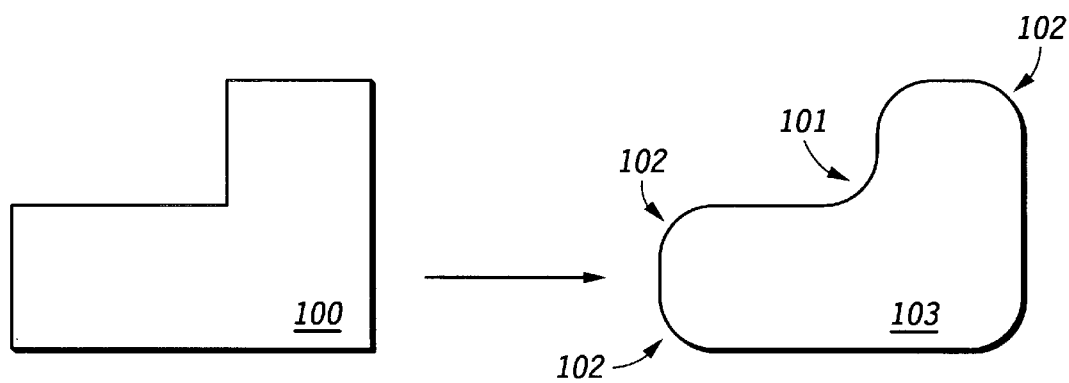
FIG. 9 illustrates a top view of altered reticle features in accordance with another embodiment of the present invention.

Another way of altering reticle generation features to create a reticle verification database more closely approximating the expected reticle features, is to apply a transform function on the reticle generation database. The transform function would generally apply rules based or model based transformations to the features of the generation database to create verification structures which closely approximate the expected reticle shape. For example, FIG. 9 illustrates a feature 100 which is a single feature which would be contained in the generation data base. A transform function, represented by the connecting arrow, is applied to the feature 100 to create the verification feature 103. As illustrated, the verification feature 103 illustrates inside corner 101 and outside corners 102 that have been rounded in a manner consistent with the actual expected results on the reticle.

The transform functions that perform the ideal feature transformation would include size, location or proximity based rules; spatial frequency based transformations such as linear and nonlinear filters or convolutions in the frequency domain of all or part of the design; or space dependent transformation such as convolutions, zone sampling integration or diffusion algorithms which act upon the space domain of all or part of the design. The use of transform functions to predict a shape on a semiconductor wafer based on its mask or reticle shape is well known in the semiconductor arts. For example, companies such as Precim Co., Trans Vector Technologies Inc., Numerical Technologies Inc., Vector Technologies Inc. and SignaMask Inc. use these techniques. However, the need for applying these techniques to predict actual reticle features for purposes of reticle verification is new. The actual transform function used will also depend on geometry sizes of features, as well as reticle processing. The selection, utilization, and modification of these filters would be known to one skilled in the art and not discussed further herein.

Because the filtered verification database will more closely approximate the actual reticle features, an increased degree of resolution can be specified to the die-to-database tool allow real defects to be detected, while allowing for expected reticle manufacturing limitation. Therefore, the further benefits of utilizing a verification database that differs from the reticle generation database are illustrated.

Thus it is apparent that there has been provided, in accordance with the invention, a process for producing a lithographic reticle and using the reticle to fabricate a semiconductor device, which fully meet the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, reticles using materiels other than metal, including ceramics and other patterned materials that absorb or scatter waves or particles, would be anticipated by the present invention. Furthermore, the present invention contemplates all methods of compensating for process bias in reticle inspection, including thickness deformation in the metal patterns, and the like. It is therefore intended to include within the invention all such variations and modifications as fall within the scope of the appended claims and equivalents thereof.

We claim:

1. A process for inspecting a semiconductor device reticle comprising the steps of:

providing a reticle generation database having a database feature;

providing a lithographic reticle based on the reticle generation database, wherein the lithographic reticle has a reticle feature corresponding to the database feature;

generating a reticle inspection database from the reticle generation database the reticle inspection database having an altered database feature altered from the database feature of the reticle generation database, wherein the reticle feature is more closely represented by the altered database feature than by the database feature; and inspecting the lithographic reticle using the reticle inspection database.

2. A process for patterning a semiconductor device comprising the steps of:

providing a reticle generation database having a plurality of database features included therein, wherein:
the plurality of database features have a predetermined characteristic dimension;

producing a lithographic reticle using the reticle generation database, the lithographic reticle having a plurality of reticle features corresponding to the plurality of database features;

providing a reticle inspection database having a plurality of altered database dimensions generated by altering the predetermined characteristic dimension of the reticle generation database, wherein the plurality of reticle features is more closely represented by the reticle inspection database than by the reticle generation database;

inspecting the lithographic reticle using the reticle inspection database; and using the lithographic reticle to create a pattern on a semiconductor substrate.

3. The process of claim 2 wherein the step of producing a lithographic reticle comprises the substep of:

forming patterned lines on the lithographic reticle.

4. The process in claim 2 wherein the step of producing a lithographic reticle comprises a substep of:

forming metal bodies on the lithographic reticle, wherein:
the metal bodies have a physical dimension; and
a process bias causes the physical dimension to differ from the predetermined characteristic dimension.

5. The process in claim 4 wherein the step of inspecting the lithographic reticle comprises:

comparing the process biased characteristic dimension of the patterned bodies to the reticle inspection database which is substantially similar to the process biased physical dimension as it differs from the predetermined characteristic dimension.

6. The process in claim 4 wherein the step of providing a reticle inspection database comprises:

smoothing features for removal from the predetermined characteristic dimension wherein a portion of an outside corner of the predetermined characteristic dimension removed, and an inside corner portion is added to an inside corner of the predetermined characteristic dimension; and the reticle inspection database is substantially similar to the process biased physical dimension of the patterned bodies as they differ from the predetermined characteristic dimension.

7. The process in claim 6 wherein the step of smoothing includes:

determining an amount of the smoothing based upon empirical measurement.

8. The process in claim 6 wherein the step of smoothing includes:

determining an amount of the smoothing based upon modeled behavior.

9. The process in claim 2 wherein the step of providing a reticle inspection database further comprises the step of:

transforming the predetermined characteristic dimension by applying a transform function to provide the plurality of altered database dimensions of the reticle inspection database.

10. The method of claim 9, wherein the step of providing a reticle inspection data base further comprises the plurality of altered database dimensions of the reticle inspection database being substantially similar to a corresponding reticle characteristic dimension.

11. The process in claim 9 wherein the step of transforming includes the transform function being based on empirical measurement.

12. The process in claim 9 wherein the step of transforming includes the transform function being based on modeled behavior.

13. The process in claim 9 wherein the step of transforming includes the transform function being a convolution transform function.

14. The process in claim 9 wherein the step of transforming includes the transform function being a spatial filter.

15. The process in claim 9 wherein the step of transforming includes the transform function being a diffusion transform function.

16. The process in claim 9 wherein the step of transforming includes the transform function being a plurality of rules.

17. A process for fabricating a semiconductor device comprising the steps of:

providing a lithographic reticle having a reticle feature based on a reticle generation database, the reticle generation database defining a database feature corresponding to the reticle feature, wherein the lithographic reticle has been inspected using a reticle inspection database which defines an altered database feature which is generated from the database feature of the reticle generation database, wherein the altered database feature more closely approximates the reticle feature than does the database feature; and using the lithographic reticle to create a pattern on a semiconductor substrate.

18. The process of claim 17, wherein the step of providing a lithographic reticle further comprises the reticle inspection database being generated by applying a transform function to the reticle generation database.

* * * * *